(12) United States Patent
Choi

(10) Patent No.: US 7,767,269 B2
(45) Date of Patent: Aug. 3, 2010

(54) METHOD FOR COATING A SUPPORT WITH A MATERIAL

(75) Inventor: Peter Choi, Orsay (FR)

(73) Assignee: EPPRA (FR)

( * ) Notice: Subject to any disclaimer, the term of this patent is extended or adjusted under 35 U.S.C. 154(b) by 942 days.

(21) Appl. No.: 10/497,052

(22) PCT Filed: Nov. 28, 2002

(86) PCT No.: PCT/FR02/04087

§ 371 (c)(1),
(2), (4) Date: Mar. 17, 2005

(87) PCT Pub. No.: WO03/046248

PCT Pub. Date: Jun. 5, 2003

(65) Prior Publication Data

US 2005/0147767 A1    Jul. 7, 2005

(30) Foreign Application Priority Data

Nov. 28, 2001 (FR) .................................. 01 15366

(51) Int. Cl.
C23C 14/48 (2006.01)
C23C 16/50 (2006.01)
C23C 16/56 (2006.01)
H05H 1/52 (2006.01)
H05H 1/46 (2006.01)

(52) U.S. Cl. ...................... 427/523; 427/525; 427/528; 427/533; 427/569; 427/580

(58) Field of Classification Search .......................... None
See application file for complete search history.

(56) References Cited

U.S. PATENT DOCUMENTS

| 4,652,357 A | 3/1987 | Colligon et al. |
| 4,714,641 A | 12/1987 | Cordts |
| 4,743,308 A | 5/1988 | Sioshansi et al. |

(Continued)

FOREIGN PATENT DOCUMENTS

| WO | WO-96/22841 A1 | 8/1996 |
| WO | WO-99/65038 A1 | 12/1999 |

OTHER PUBLICATIONS

Webster's Ninth New Collegiate Dictionary, Merriam-Webster Inc., USA, 1990 (no month), excerpt p. 438.*
Webster's Ninth New Collegiate Dictionary, Miriam-Webster Inc., publishers; Springfield, Massachusetts, USA, 1990 (no month), excerpt p. 1184.*

*Primary Examiner*—Marianne L Padgett
(74) *Attorney, Agent, or Firm*—Lerner, David, Littenberg, Krumholz & Mentlik, LLP

(57) ABSTRACT

The invention concerns a method for coating a support (10) comprising a first material with a coating layer comprising a second material, including at least a phase (A, A') for deposition of a layer of given thickness of coherent material (11, 13) on the support surface during which the interaction between an ion source and a plasma is used. The invention is characterized in that each phase (A, A') of material deposition is followed by a phase (B, B') for exposure of the support and the deposited layer of material (11, 13) to a pulse of limited duration of an ionic bombardment with high energy density of selected energy density level.

9 Claims, 1 Drawing Sheet

U.S. PATENT DOCUMENTS

| | | |
|---|---|---|
| 4,759,948 A | 7/1988 | Hashimoto et al. |
| 5,532,495 A | 7/1996 | Bloomquist et al. |
| 5,690,796 A * | 11/1997 | DuPont et al. ......... 204/192.16 |
| 6,068,726 A | 5/2000 | Pohjola |
| 6,086,726 A * | 7/2000 | Renk et al. ................ 204/192.1 |
| 6,426,125 B1 * | 7/2002 | Yang et al. .................. 427/488 |
| 6,475,573 B1 * | 11/2002 | Veerasamy et al. .......... 427/523 |
| 6,572,933 B1 * | 6/2003 | Nastasi et al. ................ 427/523 |

\* cited by examiner

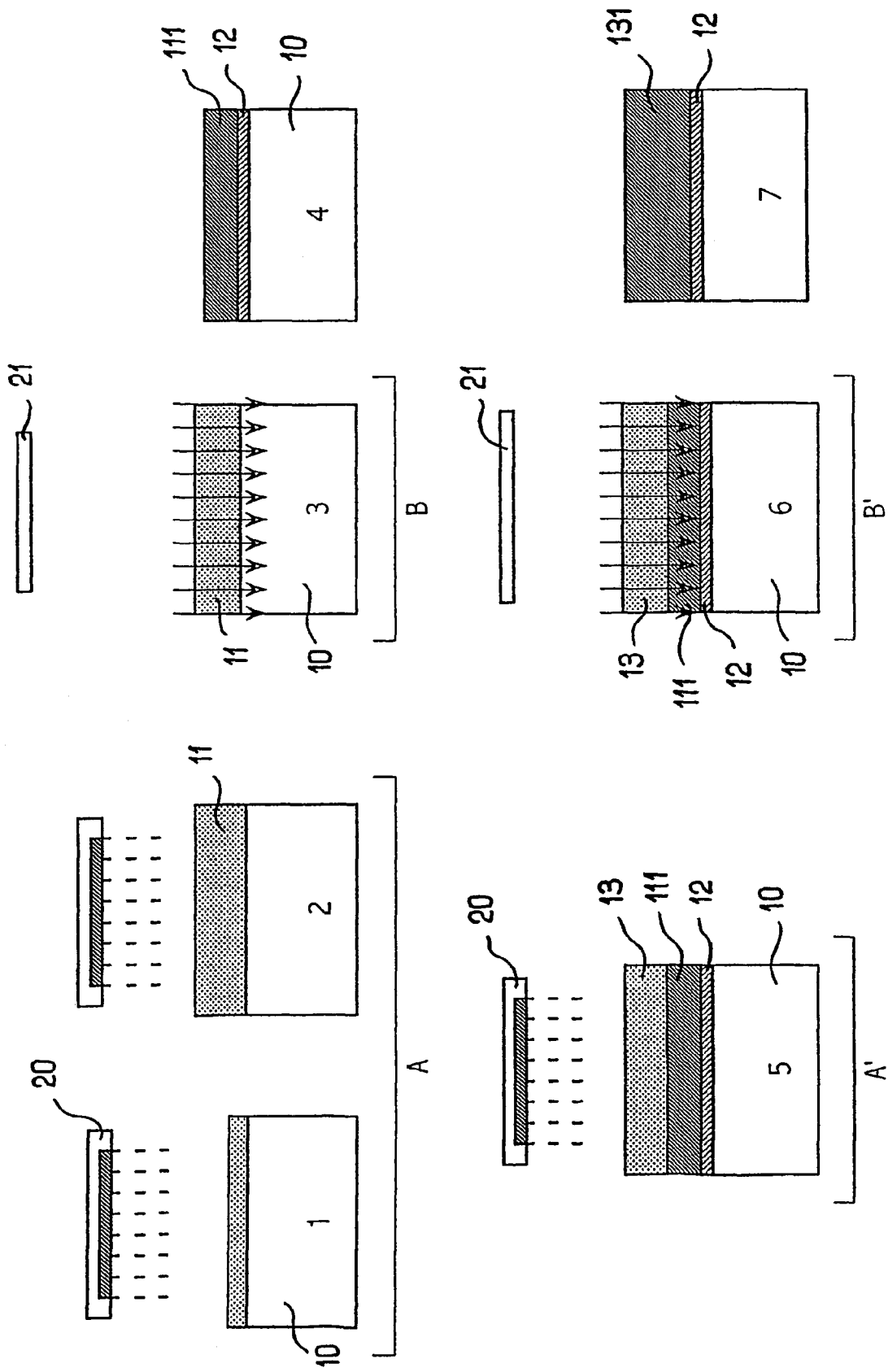

METHOD FOR COATING A SUPPORT WITH A MATERIAL

CROSS-REFERENCE TO RELATED APPLICATIONS

This application claims the benefit of the filing dates of International Application No. PCT/FR02/04087 filed Nov. 28, 2001. The disclosure of which is hereby incorporated herein by reference.

BACKGROUND OF THE INVENTION

The present invention relates in general to methods making it possible to deposit, on a support formed of a first material, a coating layer comprising a second material or multiple materials with properties differing from those of the support material.

More precisely, the invention relates to a method for coating a support, comprising at least a deposition phase of coherent material.

"Coherent material" is understood to be a material having a coherent structure (crystallographic, for example): this definition thus excludes materials in the form of liquids or powders.

Even more precisely, the invention relates to a method making it possible to obtain a very high quality coating (particularly in terms of homogeneity, uniformity of surface state, and cohesion with the support), said method, compared with known methods, having significant advantages concerning rapidity and simplicity of implementation, and cost.

The coating of objects with a layer of material with specific properties (surface state, mechanical hardness, resistance to oxidation, compactness, adherence, seal, etc.) is extremely widespread in many fields (tooling, medical, industry, etc.), and many techniques are known for depositing a layer of coating material on an object.

A first type of classical technique, known by the acronym CVD (Chemical Vapour phase Deposition) consists in provoking a chemical reaction so as to cause a material to pass into gaseous phase, and then in condensing the obtained gaseous phase on a support in such a way that the material is deposited on the support.

The implementation of this type of technique necessitates controlling the temperature and pressure conditions in order to allow the changes of state of the material to be deposited on the support. Thus techniques for deposition under vacuum are known which allow improvement of the deposit and an increase in the quantities of deposited material.

But the quality of the coatings obtained by these known techniques is limited, because the molecules of the coating material are "deposited" on the support in the literal meaning of the term, the adherence of the coating to the support then being of medium quality, which may reveal unacceptable for certain applications.

Furthermore, these techniques do not make it possible to obtain coatings with an extremely smooth surface, which is required for many applications (for example for aesthetic considerations, or for using the advantages linked to a very low friction coefficient).

It is specified that the quality of the coating obtained depends on the one hand on the original state of the support surface, and on the other hand on the deposition method; in fact the different known methods can result in very different coating qualities.

To improve the performance of this first known technique type, it is also well known to create a low temperature plasma (with ions of energy lower than 1 eV).

The migration of the coating material over the support is controlled by the temperature of the support (which can be raised by thermal irradiation) or by bombardment with the ions extracted from the deposition plasma and used to enhance the growth of the coating (ion assisted deposition) by applying a negative electric potential to the support, for example from 50 to 200 eV.

To improve the coating, it is also known to raise the temperature of the support in such a way as to obtain better contact adhesion, or to use a supplementary ion beam of a few tens of keV accompanying the deposit. These methods are supplementary methods encouraging migration of the coating material over the support.

To implement these techniques, the plasma energy determines the surface temperature of the support, which is an important factor since this temperature must be sufficiently high to enable the atoms and molecules of the coating material to be mobile and to integrate correctly with the support so as to obtain good cohesion between the support and the coating and to ensure good homogeneity of the coating.

But it is also necessary to avoid a too important rise in the temperature of the support to cause a deterioration of the support itself.

In order to reconcile these two opposing restrictions, the coating must be made very slowly, in such a way as to allow the support to diffuse outwards part of the heat received. But this coating speed limitation constitutes a significant disadvantage for industrial application.

And in any case, the very fact of exposing the support to high temperatures makes this technique fairly difficult to control, because it requires special confinement means and procedures. Furthermore, it limits the range of materials from which the support can be made.

It is also known, in combination with the techniques mentioned above, to use a laser beam to enhance the deposition of molecules of coating material on the support (the laser having to be a high power laser in the case of utilisation with a plasma).

But this improvement has only very little effect on the disadvantages described above, since the deposition speed of the coating material remains low and the coating quality limited.

Thus, different techniques have been developed to improve the quality of the coating obtained. In particular are known:
  a first type of technique using medium energy ion radiation (of the order of 20 to 30 keV) in combination with a plasma. This technique uses the energy of the ion radiation to stimulate the condensation of the coating material on the support, while respecting the crystallographic structure specific to the coating material, and enables a homogeneous spread of the coating material over the support.
    but the coating speed remains low in the case of this first technique type.
  a second type of technique using ultra-short bombardment pulses on the support by high energy density ion radiation (greater than 300 keV and associated with a fluence of the order of 1 J/cm$^2$), which produces a higher quality coating (very homogeneous coating, able to be as smooth as glass), following the fusion of the superficial layer which mixes with the coating material during each ultra-short pulse, before solidifying by ultra-rapid cooling (a phenomenon known as "quenching").

However, it is difficult to envisage operating this second type of technique on an industrial scale, since it is slow, as like the techniques described above (the proportion of energetic ions bombarding the support during each pulse being only of the order of one per million particles of the unitary surface of the irradiated solid). Furthermore, the cost associated with producing very high-energy pulses at sufficiently high frequencies for making coatings of a significant thickness, is prohibitive.

Document U.S. Pat. No. 6,086,726 provides information about a method combining bombardment by an ion beam with one step of coating a support.

The method disclosed in this document thus comprises a single coating step, after which the coated support is bombarded with high-energy ions.

It is to be noted that in this method the ion bombardment can produce effects at very variable depths in the thickness of the coating layer and/or of the support.

This document indicates, in particular, that:

in certain implementation modes, said depth is of the order of only a tenth of the thickness of the coating layer, indicating that only part of this coating layer is affected by bombardment, whereas in other implementation modes, said depth can be greater than the thickness of the coating layer. With regard to this, particular reference should be made in this document to column 4 lines 47 and following.

Thus it appears that the method disclosed in this document does not include precise control of the ion bombardment conditions (and in particular the energy level of the bombarded ions), for obtaining a precise and precisely localised effect (for example between the coating layer and the coated support).

Moreover, it should be noted that this method comprises only a single coating step, and does not envisage any succession of several coating steps.

Also known, from document WO 99/65 038, is a method including the repetition of an operation consisting in successively adding powder on a support, then making at least one component of this powder melt through exposure to an ion beam, to create an alloy.

It will be noted that this method does not in any way involve a coating operation, since the deposited powder is not assimilated with a coherent coating of given structure such as that described below and concerned by the present invention.

In particular, in the method of document WO 99/65 038, the effect of ion bombardment is to give the layer of powder a structural coherence that is totally absent before this bombardment.

It is to be recalled that the invention lies within the framework of the improvement of coherent coatings.

And, on the contrary, the method of document WO 99/65 038 concerns a very special case of utilisation of a powder (non-coherent), and the creation of a coherent structure through exposure to an ion beam.

Finally, from document U.S. Pat. No. 4,759,948, a method is known which is intended to make a surface to be coated uniform, said method involving exposure of the support surface to be coated to an ion beam.

This method thus only provides information about a preparatory step before a coating.

And it should be noted that the energy of the ion beam is consequently not adapted to causing fusion of the surface.

Thus it can be seen that as a whole the known methods have restrictions, or are not adapted to the aim of the invention.

SUMMARY OF THE INVENTION

A goal of the invention is to make it possible to overcome these restrictions.

Another goal of the invention is to make it possible to produce a very high quality coating, simple and rapid to operate, and at low cost.

A further goal of the invention is to produce a very high quality coating on supports constituted of various materials, able to be at very low deformation, wetting or softening temperatures.

In order to achieve these goals, the invention proposes a method for coating a support comprising a first material with a coating layer comprising a second material, having at least one deposition phase of a layer of given thickness of coherent material on the surface of the support, during which the interaction between an ion source and a plasma is used, characterized in that each material deposition phase is followed by a phase of exposure of the support and the layer of deposited material to a pulse of limited duration of high energy density ion bombardment for the chosen energy density level.

Preferred, but non-limiting, aspects of the method according to the invention are as follows:

The energy level of the ions bombarded during a phase of exposure to an ion bombardment pulse is chosen such that these ions cross the thickness of the layer of material deposited during the material deposition phase preceding said phase of exposure to a pulse of ion bombardment, to dissipate the energy remaining after this crossing into a region immediately adjacent to the base of said layer of deposited material, The method comprises repeated sequences formed of a deposition phase and an exposure phase to ion bombardment, Each ion bombardment pulse has a duration of less than a microsecond, Each ion bombardment pulse has a duration shorter than one hundred nanoseconds, The energy level of bombarded ions is of the order of at least 300 to 500 keV, The plasma source used in the phases for depositing material is a plasmatron, or a plasma arc source, The support material is a metal, a composite material or a plastic material, The high energy density ions correspond to an energy input on the support of the order of from 0.01 to 5 Joules per square centimeter, The high energy density ions correspond to an energy input on the support of the order of 0.1 to 2 Joules per square centimeter, The high energy density ions correspond to an energy input on the support of 1 Joule per square centimeter, The coating thickness is of a desired thickness, Said thickness is of the order of 20 microns.

BRIEF DESCRIPTION OF THE DRAWINGS

Other aspects, goals and advantages of the invention will be understood more clearly by reading the following description of an embodiment of the method according to the invention, with reference to the accompanying drawing.

FIG. 1 diagrammatically shows the succession of the principal steps of the method according to the invention.

DETAILED DESCRIPTION OF THE INVENTION

With reference to this single FIGURE, first in step 1 a support 10 is exposed to the radiation from a plasma source 20 of plasmatron type, or a high current plasma arc source (cathode arc or vacuum arc source), or any other plasma source. The source 20 is itself situated within a plasma.

In fact the plasma source 20 is situated, as is the support, within a chamber containing an ambient plasma. In general, this ambient plasma is a low energy plasma.

An energy source 21 is also shown in reference to steps B and B' of the FIGURE.

It is to be noted that the source 21 can in general also be any source of high energy density ions. By "high energy density ions" one means ions whose flux directed towards a support previously coated with a coating layer possesses sufficient energy to penetrate the support beyond the coating layer previously deposited.

More precisely, high energy density ions must be able to penetrate to a depth of the order of at least 1.5 times the thickness of the coating layer.

Furthermore, the high energy density ions must not only penetrate the support as mentioned above but must still be able to transfer their energy to the support material in such a way as to raise the material of said support from a normal ambient temperature of the order of 25 degree C. to the fusion temperature of said support material.

This definition of high energy density ions will be better understood by reading the following part of the description.

It is to be recalled that plasmatron sources are high power thermal arc sources, using the discharge from an arc produced by a high current between concentric electrodes in a configuration that can be plane or cylindrical, inside a precursor gas, the arc being stabilized by high speed rotation of elements of the device.

In the application concerned here, a plane plasmatron can be used in which the cathode is a flat disk surrounded by a ring-shaped anode, and the arc is formed inside a gas that may be inert or reactive, said arc being stabilized by a turning magnetic field.

The support 10 can be any support to be coated (tool or other), and be constituted of a substance chosen from among a very wide range of metals, oxides, carbides or nitrides, or even composite materials (including ceramics) or plastics.

It will be seen that one of the advantages of the method according to the invention is that it can be applied to very many types of support (even those with very low fusion temperature), without melting or damaging these as a result of an excessive heating.

In the case of the invention one advantage is that the temperature of the support must not necessarily be raised above a value of the order of 40 degrees C.

It is indeed to be noted that according to the invention there is no need to heat the support before the coating step. However, the support may heat slightly following exposure to high energy density ion radiation, as will be described in more detail in the text below.

In any case, during this heating, the support temperature does not exceed a value of the order of 40 degrees C.

The particles can, for example, be TiN or CrN, but the method also applies to any type of coating particles.

When the thickness of the layer 11 has reached a predetermined value (0.5 microns, for example) as shown in step 2, the supply from source 20 is cut off to stop particles being deposited on the support.

In order to do this, the supply from source 20 can be controlled by a system using a neuronal network enabling the operation of the source to be controlled in real time.

Steps 1 and 2 thus constitute a phase A of non-interrupted material deposition on the support, enabling a layer of significant thickness to be obtain rapidly.

But as such, the deposit obtained in this way may have limited qualities of homogeneity, adherence to the support and surface state (the layer may have a structure comprising areas with lower density and/or sheets or plates).

According to the invention, this phase A of material deposition is succeeded by a phase B corresponding to step 3, during which the support 10 and the layer 11 covering it are exposed to an ultra-short pulse (of a duration usually less than a microsecond, and for example, shorter than 100 nanoseconds) of light ion radiation whose energy is at least of the order of 300 to 500 keV, which must ensure a surface heat quantity on the support of the order of 1 Joule per square centimeter.

It is this flux of light ions that corresponds to the high energy density ions defined above, and which constitutes an important element of the invention.

It is noted that the value of 1 Joule per square centimeter is given as an indicative average value; in any case the quantity of surface heat on the support induced by exposure to the pulsed radiation of high energy density ions is usually comprised between 0.01 and 5 Joules per square centimeter.

Nonetheless, it can be seen that for most materials this value is comprised within an interval ranging from 0.1 to 2 Joules per square centimeter. These values depend on the nature of the support material.

It is also noted that the duration of the ultra-short pulse (whose length is as indicated above, of the order of 100 nanoseconds), also depends on the nature of the support. The duration of this pulse must be defined so as to be fairly short, to prevent progressive and continuous diffusion in the support of heat supplied by the high energy density ions.

In any case, the duration of the pulse and the level of ion energy density are chosen such that the ions cross the thickness of the coating layer of the material deposited during the deposition phase of material preceding the phase of exposure to a pulse of ion bombardment, to dissipate the energy that these ions conserve after crossing the coating layer in a region immediately adjacent to the base of said coating layer.

The energy level of the ions used in this second phase is thus chosen such that these ions cross the layer 11 to reach the region of the support adjacent to this layer, and deliver their remaining energy in this region of the support (which has a thickness of the order of a micron).

In practice, the ion energy level is chosen such that the ions cross approximately the whole thickness of layer 11, as well as a superficial region of the support 10 adjacent to the layer 11 and of a thickness that can, for example, be of the order of a micron, before dissipating their remaining energy.

More precisely, the ions deliver part of their energy when they cross the layer 11, and thus modify the structure of this layer. The remaining part of the ion energy is dissipated in the region of the support adjacent to the layer 11 to provoke the creation of an alloy between this superficial region of the support and the material of layer 11.

The fluence associated with this operation must be sufficient to bring the layer of material situated in the zone within reach of the ions from the temperature of the support to the temperature just above the fusion point of said material of layer 11. Phase B is therefore a structure alteration phase.

As shown in step 4, after phases A and B one thus obtains a coating of the support 10 that is constituted of an upper layer 111 resulting from the change in the layer 11 by the ions bombarded during phase B and a thinner intermediate alloy layer 12 between layer 111 and the support 10.

The intermediate alloy layer 12 that has been constituted by fusion of the lower level of layer 11 and the adjacent region of the support thus guarantees very high cohesion between the support and its coating.

As soon as the ultra-short ion bombardment pulse has ended, the intermediate layer 12 and the layer 111 cool down extremely quickly (at a cooling speed of the order of $10^9$ to $10^{10}$ degrees per second), because of the very high temperature gradient created in these regions (the heat associated with the energy of the ions not having had time to diffuse within the support).

This rapid cooling of the "quenching" type:
causes re-solidification of the modified region 12, which provides the ensemble (support+coating layers) with very high cohesion,
and stimulates the alteration of the structure of the layer 111 and its hardening, thanks to which this layer 111 has an amorphous structure of very fine granulometry with a microstructure that includes nanocrystalline and metastable phases, and its structure and surface state are of extremely high quality, comparable to the quality mentioned in the introduction to the present text.

The brevity of the pulse during which the support 10 and the coating layer 11 are submitted to ion radiation (of the order of a nanosecond) enables:
prevention of heating the support, which remains at a temperature of the order of 40 degrees C. This property is particularly advantageous because it allows the method according to the invention to be used on a very wide variety of support types,
not delaying the general implementation of the method, whose operating speed is determined by the duration of phase A for depositing material.

Thus it is shown that the sequence of phases A and B makes it possible to produce an extremely high quality coating in terms of density, homogeneity, cohesion with the support, surface state, and significant thickness, all in a simple (no heating of the support) and rapid manner.

Furthermore, this method can be applied over a very wide variety of supports, contrary to the majority of existing methods.

In addition, it is possible to obtain a greater coating thickness by repeating, as many times as necessary, the alternation of a deposition phase of material A' during which the support 10, the transition layer 12 and the upper layer 111 of step 4 are again exposed to the plasma source 20 activated in its plasma, in order to constitute a new deposit 13 of the layer 111 (step 5).

When the thickness of the new layer 13 has reached a predetermined thickness (here, for example, of the order of 0.5 microns), the support 10 and the layers coating it are again exposed to an ultra-short pulse of ion bombardment, in a step 6 constituting phase B'.

Here again, the energy associated with the ions is chosen such that these ions, bombarded during phase B', cross the layer 13, to reach the intermediate region between the coating 13 and its support 111 and to provoke fusion and the creation of an alloy between the layer 13 and the upper level of layer 111 (having taken care to choose a thickness for the layer 13 deposited during phase A' sufficiently small for the bombarded ions to be able to cross this layer).

Thus one obtains an alteration and a hardening of the layer 13, and very good quality anchorage onto the coating already produced.

And even though the surface energy level associated with the ions bombarded during B and B' is of the order of only 1 to 2 Joules per square centimeter, this energy is dissipated in the intermediary region between the last coating layer and the last support, a region with a thickness of only 1 to 2 microns, corresponding to volumic energy transfer levels of the order of $10^4$ Joules per cubic centimeter, sufficient to produce fusion (contrary to what happens in known "ion implantation" techniques).

Thus, in 7, a support is obtained that is coated with a coating layer 131 of extremely high quality, and it is possible to repeat alternating material deposition phases and ion bombardment phases to bring the thickness of this layer 131 to a desired value.

In this case, each sequence between a phase of deposition of material and of structure alteration makes it possible to increase the total thickness of the coating, and also to harden and anchor the new deposit on the coating already formed.

Here again, the duration of the structure alteration phases and cooling is negligible compared with the duration of the material deposition phases, such that the B and B' structure alteration phases do not lower the speed at which the method according to the invention is operated, said speed being determined by the deposition phases A and A'.

In this way the applicant has determined that the overall speed of coating can be of the order of 0.5 microns per minute, which is entirely compatible with industrial application.

With reference to known coating techniques assisted by medium energy ion bombardment, the method according to the invention is also much faster, and in addition offers the advantage associated with the creation of an alloy between the coating and the support, which considerably raises the cohesion qualities of the assembly.

Moreover it can be noted that relative to techniques of the type disclosed by document U.S. Pat. No. 6,086,726, the method according to the invention makes it possible to obtain very significant surface coatings, with thicknesses able to be of the order of several microns (the applicant having obtained coating thicknesses of the order of 20 microns or more).

This repetition of alternative phases of deposition and bombardment carried out under specific conditions makes it possible, in fact, to produce excellent quality coatings of desired thickness.

The deposition phase of coherent material enables rapid deposition of a desired quantity of coating material.

The structure alteration phase of said deposit, carried out by ion bombardment at a very precisely chosen energy level, makes it possible to use a very short and very intense ion bombardment pulse.

And the choice of bombardment energy, made such that the ions penetrate just beyond the average depth of the new coating, provides maximum efficiency, in particular concerning the solidarization of the new coating and the existing structure.

Moreover, the energy density deposited by the ion beam in the coating layer and in the substrate is chosen in such a way as to be sufficient to melt the zone crossed by the ion beam, but also to remain below a value that could lead to vaporization of material in this zone.

The energy brought to said zone thus causes rapid fusion of the local material.

And this fused material, made up of the new coating and the upper layer of the substrate, is subjected to a rapid quenching phenomenon and re-solidifies as soon as the bombardment pulse has ended.

This quenching leads to the formation of nano-crystalline structures and metastable alloys, moreover offering extremely high coherence between the coating layer and the substrate.

As mentioned above, the repetition of these two phases results in production of a coating of desired thickness, layer after layer, on a starting substrate.

Following the fusion effect caused by the ion energy beam, each successive coating layer is fused with the surface immediately beneath.

The result is that all the successive coating layers are fused together, forming a same and single layer extending from the starting substrate.

Furthermore, the method according to the invention is simple to operate (in particular because the temperature of the support of the order of 40 degrees C. does not require any specific protection means or confinement) and is therefore easily reproducible.

The invention claimed is:

1. A method for coating a support comprising a first material with a coating layer comprising a second material, the method comprising successively and independently:

in a material deposition step, depositing a coating layer comprising the second material having a given thickness on the support using an in situ source of plasma, and in a bombardment step, exposing the support and the deposited coating layer to an ion bombardment pulse at a predetermined energy density level for a predetermined duration, wherein the predetermined duration of the pulse and the predetermined energy density level of bombarded ions during the bombardment step are chosen such that the bombarded ions have sufficient energy to penetrate the coating layer and beyond the coating layer only to a region immediately adjacent to the coating layer and to transfer their energy to the coating layer and to the immediately adjacent region to create:

an upper layer formed by cooling of an upper portion of the coating layer at a cooling speed of between about $10^9$ and $10^{10}$ degrees per second, said upper layer consisting of the second material and having an amorphous structure of finer granularity than the deposited coating layer before the bombardment step; and an intermediate layer resulting from fusion of a lower portion of the coating layer and the immediately adjacent region, wherein the intermediate layer includes an alloy including the first material and the second material.

2. The method according to claim 1, wherein the method includes repetition the material deposition step and the bombardment step in order to increase a total thickness of a layer consisting of the second material.

3. The method according to claim 2, wherein the total thickness of the layer consisting of the second material is 20 microns.

4. The method according to claim 1, wherein the predetermined duration of the ion bombardment pulse is less than a microsecond.

5. The method according to claim 4, wherein the predetermined duration of the ion bombardment pulse is less than a hundred nanoseconds.

6. The method according to claim 1, wherein the energy of the bombarded ions is about or greater than 300 keV.

7. The method according to claim 1, wherein the plasma source used in the material deposition step is a plasmatron, or a plasma arc source.

8. The method according to claim 1, wherein the support material is a metal, a composite material or a plastic material.

9. The method according to claim 1, wherein the predetermined energy density level of the ions corresponds to an energy input on the support of the order of 0.01 to 5 Joules per square centimeter.

* * * * *

UNITED STATES PATENT AND TRADEMARK OFFICE
CERTIFICATE OF CORRECTION

| | | |
|---|---|---|
| PATENT NO. | : 7,767,269 B2 | Page 1 of 1 |
| APPLICATION NO. | : 10/497052 | |
| DATED | : August 3, 2010 | |
| INVENTOR(S) | : Peter Choi | |

It is certified that error appears in the above-identified patent and that said Letters Patent is hereby corrected as shown below:

Column 10, line 14, "repetition the" should read --repetition of the--.

Signed and Sealed this
Fourth Day of October, 2011

David J. Kappos
*Director of the United States Patent and Trademark Office*